United States Patent
Takazawa

(10) Patent No.: US 7,251,120 B2
(45) Date of Patent: Jul. 31, 2007

(54) MONOLITHIC CERAMIC ELECTRONIC COMPONENT AND METHOD FOR MAKING THE SAME

(75) Inventor: Tomoo Takazawa, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 222 days.

(21) Appl. No.: 10/526,409

(22) PCT Filed: Aug. 31, 2004

(86) PCT No.: PCT/JP2004/012546

§ 371 (c)(1),
(2), (4) Date: Mar. 2, 2005

(87) PCT Pub. No.: WO2005/034151

PCT Pub. Date: Apr. 14, 2005

(65) Prior Publication Data

US 2006/0014303 A1    Jan. 19, 2006

(30) Foreign Application Priority Data

Sep. 30, 2003  (JP) .............................. 2003-341438

(51) Int. Cl.
    *H01G 4/06*  (2006.01)
(52) U.S. Cl. .................. 361/321.2; 361/321.1; 361/311; 361/312; 361/313; 361/320
(58) Field of Classification Search ............. 361/321.1, 361/321.2, 306.3, 311–313, 320, 328–329
See application file for complete search history.

(56) References Cited

U.S. PATENT DOCUMENTS 6,252,481 B1 * 6/2001 Iwao et al. .................... 336/83
6,284,060 B1 9/2001 Matsutani et al.
6,476,690 B1 * 11/2002 Nakata et al. ............... 333/185
6,477,031 B1 * 11/2002 Hayashi .................... 361/306.3
6,582,796 B1 * 6/2003 Joulin et al. ................ 428/116

(Continued)

FOREIGN PATENT DOCUMENTS

JP        06-232005        8/1994

(Continued)

OTHER PUBLICATIONS

Written Opinion of the International Search Authority, Nov. 30, 2004.

(Continued)

*Primary Examiner*—Nguyen T. Ha
(74) *Attorney, Agent, or Firm*—Keating & Bennett, LLP

(57) ABSTRACT

A monolithic ceramic electronic component includes a low-permeability coil portion formed by stacking low-permeability ceramic green sheets, a first coil and a relatively large number of pores, and a high-permeability coil portion formed by stacking high-permeability ceramic green sheets, a second coil and a relatively small number of pores. The first coil and the second coil are electrically connected in series to form a spiral coil. The coil portion composed of a ferrite ceramic having a small number of pores has a high permeability and a high dielectric constant, and the coil portion composed of a ferrite ceramic having a large number of pores has a low permeability and a low dielectric constant.

19 Claims, 5 Drawing Sheets

U.S. PATENT DOCUMENTS

| | | | |
|---|---|---|---|
| 6,589,446 B1 * | 7/2003 | Nakamura et al. | 252/363.5 |
| 6,762,925 B2 * | 7/2004 | Uchida et al. | 361/321.1 |
| 6,803,839 B2 * | 10/2004 | Azuma et al. | 333/185 |
| 2003/0214793 A1 | 11/2003 | Uchida et al. | |

FOREIGN PATENT DOCUMENTS

| | | |
|---|---|---|
| JP | 09-007835 | 1/1997 |
| JP | 11-238613 | 8/1999 |
| JP | 11-354376 | 12/1999 |
| JP | 2004-297020 | 10/2004 |

OTHER PUBLICATIONS

Official Communication issued in corresponding Chinese Patent Application No. 200480000759.4, dated Sep. 8, 2006.

Official Communication issued in the corresponding Korean Patent Application No. 10-2005-7004422, mailed on Jun. 26, 2006.

* cited by examiner

MONOLITHIC CERAMIC ELECTRONIC COMPONENT AND METHOD FOR MAKING THE SAME

BACKGROUND OF THE INVENTION

1. Field of the Invention

The present invention relates to monolithic ceramic electronic components and methods for making the same. More particularly, the present invention relates to monolithic ceramic electronic components, such as monolithic inductors, monolithic capacitors, and monolithic LC composite components, and methods for making the same.

2. Description of the Related Art

In conventional noise suppression chip components, in order to ensure high impedance in the wide frequency range so that a noise reduction effect is achieved, for example, a component is fabricated by stacking a high-permeability magnetic layer and a low-permeability magnetic layer with a coil being disposed in each layer, and connecting the coils in series.

As an example of such a component, Patent Document 1, Japanese Unexamined Patent Application Publication No. 9-7835, discloses a monolithic inductor having a structure in which a high-permeability magnetic layer and a low-permeability magnetic layer are integrally laminated with a nonmagnetic intermediate layer therebetween. The nonmagnetic intermediate layer prevents interdiffusion between the material of the high-permeability magnetic layer and the material of the low-permeability magnetic layer, and prevents degradation in the magnetic properties of both magnetic layers.

Furthermore, Patent Document 2, Japanese Unexamined Patent Application Publication No. 6-232005, discloses a monolithic LC composite component having a structure in which a capacitor portion and a coil portion are composed of dielectric layers having different dielectric constants, and the dielectric layers having different dielectric constants are integrally laminated.

However, in the case in which a nonmagnetic intermediate layer is used as in the monolithic inductor of Patent Document 1, the bonding strength is lower compared with the case in which magnetic layers are directly bonded to each other. Furthermore, in order to obtain satisfactory bonding, the magnetic layers and the nonmagnetic intermediate layer must be adjusted to have the same shrinkage rate during firing, which requires troublesome processes and techniques. Furthermore, a new material for the intermediate layer must be prepared, which is one of the factors causing increases in manufacturing costs. The monolithic LC composite component of Patent Document 2 also has substantially the same problem.

SUMMARY OF THE INVENTION

In order the solve the problems described above, preferred embodiments of the present invention provide a monolithic ceramic electronic component which does not require an intermediate layer and in which the dielectric constant and the permeability are less limited, and also provide a method for making such a unique monolithic ceramic electronic component.

A monolithic ceramic electronic component according to a preferred embodiment of the present invention includes a first element portion including a laminate of ceramic layers and internal electrodes, and a second element portion including a laminate of ceramic layers and internal electrodes, wherein at least the first element portion and the second element portion are stacked to define a ceramic laminate, and the porosity of the ceramic layers of the first element portion is different from the porosity of the ceramic layers of the second element portion.

For example, the first element portion includes a first coil formed by electrically connecting the internal electrodes, the second element portion includes a second coil formed by electrically connecting the internal electrodes, and the first coil and the second coil are electrically connected to define an inductor. Alternatively, the first element portion includes a coil formed by electrically connecting the internal electrodes, the second element portion includes a capacitor in which any two adjacent electrodes are separated by a ceramic layer, the porosity of the ceramic layers of the second element portion is lower than the porosity of the ceramic layers of the first element portion, and the coil and the capacitor are electrically connected to define an LC filter.

If a ceramic layer contains a high proportion of pores, the permeability and the dielectric constant decrease. Therefore, even using the same material, by setting different porosities, it is possible to obtain a first element portion and a second element portion with different permeabilities and different dielectric constants.

Furthermore, a method for making a monolithic ceramic electronic component according to another preferred embodiment of the present invention includes the steps of stacking ceramic layers and internal electrodes to form a first element portion, stacking ceramic layers and internal electrodes to form a second element portion, and stacking at least the first element portion and the second element portion to form a ceramic laminate, wherein the amount of a granular evaporative pore-forming agent incorporated into a ceramic slurry for forming the ceramic layers of the first element portion is different from the amount of the granular evaporative pore-forming agent incorporated into a ceramic slurry for forming the ceramic layers of the second element portion so that the first element portion and the second element portion have different porosities of ceramic layers.

Either the ceramic slurry for forming the ceramic layers of the first element portion or the ceramic slurry for forming the ceramic layers of the second element portion may not be incorporated with the granular evaporative pore-forming agent.

In accordance with various preferred embodiments of the present invention, by setting the porosity of the ceramic layer of the first element portion to be different from the porosity of the ceramic layer of the second element portion, even if the ceramic layer of the first element portion and the ceramic layer of the second element portion are made of the same material, it is possible to produce the first element portion and the second element portion having different permeabilities and different dielectric constants. As a result, it is not necessary to provide an intermediate layer, and it is possible to obtain a monolithic ceramic electronic component with high design freedom with respect to the dielectric constant and the permeability.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of monolithic ceramic electronic components and methods for making the same in accordance with the present invention will be described below with reference to the attached drawings.

First Preferred Embodiment, FIGS. 1 to 5

Figure 1:
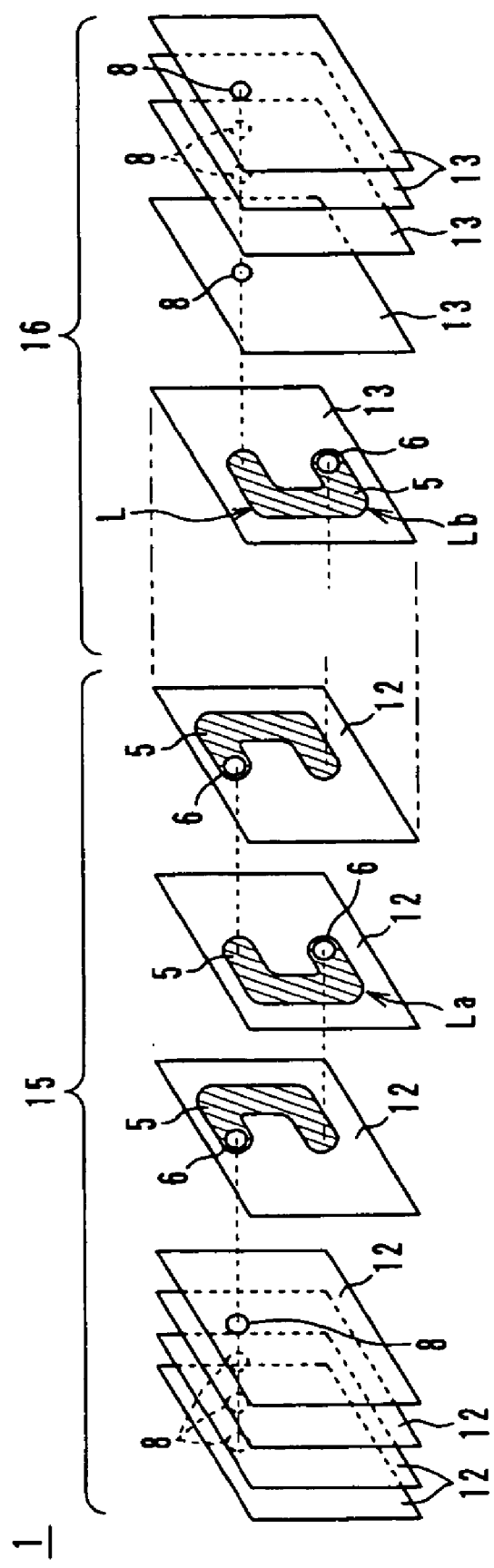
FIG. 1 is an assembly view which shows a monolithic ceramic electronic component according to a first preferred embodiment of the present invention.

As shown in FIG. 1, a monolithic inductor 1 includes low-permeability ceramic green sheets 12 for internal layers provided with coil conductive patterns 5 and via-holes 6 for interlayer connection, low-permeability ceramic green sheets 12 for external layers provided with via-holes 8 for extraction, high-permeability ceramic green sheets 13 for internal layers provided with coil conductive patterns 5 and via-holes 6 for interlayer connection, and high-permeability ceramic green sheets 13 for external layers provided with via-holes 8 for extraction.

The high-permeability ceramic green sheet 13 is produced as follows. Starting materials of oxides of nickel, zinc, and copper are preferably mixed and calcined at about 800° C. for about one hour, for example. The calcined mixture is pulverized with a ball mill, followed by drying. Thereby, an Ni—Zn—Cu ferrite starting material (mixed oxide powder) with an average particle size of about 2 μm, for example, is obtained.

Subsequently, a solvent, a binder, and a dispersant are added to the ferrite starting material, and mixing is performed to form a slurry. Subsequently, using the ferrite starting material in the form of slurry, a high-permeability ceramic green sheet 13 with a thickness of about 40 μm, for example, is formed by a doctor blade process or other suitable process.

On the other hand, the low-permeability ceramic green sheet 12 is produced as follows. Starting materials of oxides of nickel, zinc, and copper are preferably mixed and calcined at about 800° C. for about one hour, for example. The calcined mixture is pulverized with a ball mill, followed by drying. Thereby, an Ni—Zn—Cu ferrite starting material (mixed oxide powder) with an average particle size of about 2 μm, for example, is obtained.

Subsequently, a spherical evaporative pore-forming agent composed of a commercially available spherical polymer, for example, spherical crosslinked polystyrene with an average particle size of about 8 μm, for example, is preferably added to the ferrite starting material, and a solvent, a binder, and a dispersant are further added thereto, followed by mixing to form a slurry. In the first preferred embodiment of the present invention, as the evaporative pore-forming agent, TECHPOLYMER (trade name) manufactured by Sekisui Plastics Co., Ltd. is preferably added to the ferrite starting material so as to achieve a porosity of about 60%, for example. Subsequently, using the ferrite starting material in the form of slurry, a low-permeability ceramic green sheet 12 with a thickness of about 40 μm is formed by a doctor blade process or other suitable process. The evaporative pore-forming agent is burned off during firing in the post process, and thereby pores are formed.

The coil conductive pattern 5 is preferably composed of Ag, Pd, Cu, Au, or an alloy of these metals, and is formed by screen printing or other suitable process. In order to form the via-hole 6 for interlayer connection or the via-hole 8 for extraction, a hole for the via-hole is opened using a laser beam or the like, and the hole is filled with a conductive paste composed of Ag, Pd, Cu, Au, or an alloy of these metals.

The coil conductive patterns 5 are electrically connected in series through via-holes 6 for interlayer connection to form a spiral coil L. Both ends of the spiral coil L are electrically connected to the via holes 8 for extraction.

Figure 2:
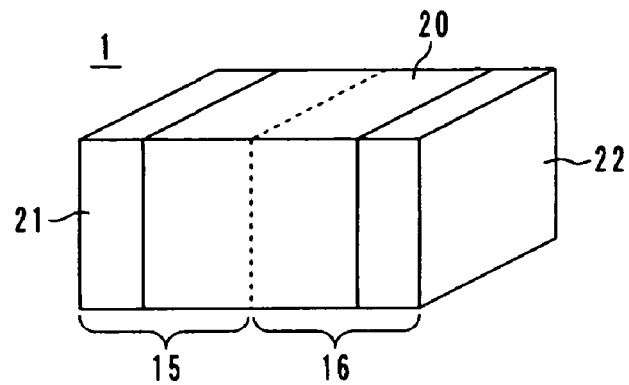
FIG. 2 is a perspective view which shows an appearance of the monolithic ceramic electronic component shown in FIG. 1.

The individual sheets 12 and 13 are stacked and press-bonded to produce a substantially rectangular parallelepiped ceramic laminate 20 as shown in FIG. 2. The ceramic laminate 20 is subjected to heat treatment (binder removal treatment) at about 400° C. for about 3 hours, for example, and firing is then performed at about 915° C. for about 2 hours. A sintered ceramic laminate 20 is thereby obtained.

As a result, in a low-permeability coil portion 15 formed by stacking the low-permeability ceramic green sheets 12, a first coil La including coil conductive patterns 5 which are electrically connected in series and many pores 32 (refer to FIG. 3) are formed. The average size of the pores 32 is preferably about 5 μm to about 20 μm, and preferably, the pore content by volume (porosity) in the low-permeability coil portion 15 is preferably about 30% to about 80%. The porosity of the low-permeability coil portion 15 is calculated according to the following formula, provided that the specific gravity of the pore (air) is 0 g/cm³:

Porosity of low-permeability coil portion 15={1−(W/V)/G}×100(%)

W: Total weight of ceramic sheets 12 only of low-permeability coil portion 15 (after firing)

V: Volume of ceramic sheets 12 only of low-permeability coil portion 15 (after firing)

G: Theoretical density of ferrite starting material

If the porosity is less than about 30%, the dielectric constant increases, and it is not possible to decrease the dielectric constant sufficiently. If the porosity exceeds about 80%, the mechanical strength of the low-permeability coil portion 15 after firing is decreased, and it becomes difficult to subsequently perform resin impregnation, etc., which is undesirable.

On the other hand, in a high-permeability coil portion 16 formed by stacking the high-permeability ceramic green sheets 13, a second coil Lb including coil conductive patterns 5 which are electrically connected in series and a small number of pores are formed. The second coil Lb and the first coil La are electrically connected in series to form a spiral coil L. The pores are generated by air bubbles included when the ferrite starting material in the form of slurry is prepared and the volatile components of the binder and the dispersant. However, the number of pores formed in the high-permeability coil portion 16 is small, and the porosity is about 10% or less. The porosity of the high-permeability coil portion 16 is calculated according to the following formula:

Porosity of high-permeability coil portion $16=\{1-(W1/V1)/G\} \times 100(\%)$

W1: Total weight of ceramic sheets 13 of high-permeability coil portion 16 (after firing)

V1: Volume of ceramic sheets 13 of high-permeability coil portion 16 (after firing)

G: Theoretical density of ferrite starting material

Additionally, the pores formed in the low-permeability coil portion 15 and the high-permeability coil portion 16 include open pores and closed pores. The high-permeability coil portion 16 must have a high permeability relative to the low-permeability coil portion 15. Depending on the specification of the monolithic inductor 1, an evaporative pore-forming agent may be added to the ceramic green sheet 13 of the high-permeability coil portion 16.

Next, external electrodes 21 and 22 are formed on both end surfaces of the sintered ceramic laminate 20. The external electrodes 21 and 22 are electrically connected to the spiral coil L through the via-holes 8 for extraction. Folded portions of each of the external electrodes 21 and 22 extend over four side surfaces. The external electrodes 21 and 22 are formed by coating, baking, or other suitable process.

Next, the sintered ceramic laminate 20 is immersed in an epoxy resin with a dielectric constant of about 3.4 (alternatively, in a water-soluble glass) so that the pores are filled with the epoxy resin and an epoxy resin film is formed on the surface of the sintered ceramic laminate 20. Subsequently, the epoxy resin is cured at about 150° C. to about 180° C. (for about 2 hours), for example. Since the baking temperature for the external electrodes 21 and 22 is high at about 850° C., preferably the external electrodes 21 and 22 are formed before the impregnation of the resin.

Figure 3:
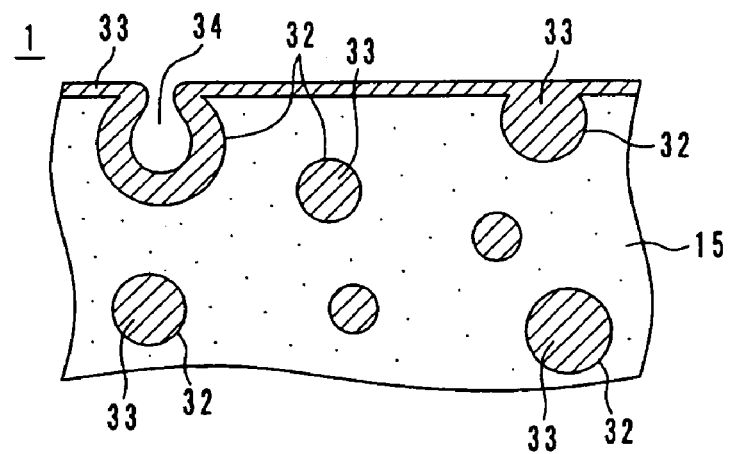
FIG. 3 is an enlarged cross-sectional view which schematically shows a portion of the monolithic ceramic electronic component shown in FIG. 2.

FIG. 3 is an enlarged cross-sectional view showing a portion of the low-permeability coil portion 15 of the sintered ceramic laminate 20. A plurality of pores 32 are formed in the sintered ceramic laminate 20. The pores 32 are filled with an epoxy resin 33, and the surface of the sintered ceramic laminate 20 is also covered with the epoxy resin 33. About 30% to about 70% by volume of the pores 32 is filled with the resin 33. More specifically, the pores 32 may be entirely filled with the resin 33, or the pores 32 may be partially filled with the resin 33, and in such a case, a pore 34 is further formed in the pore 33 partially filled with the resin 33.

Figure 4:
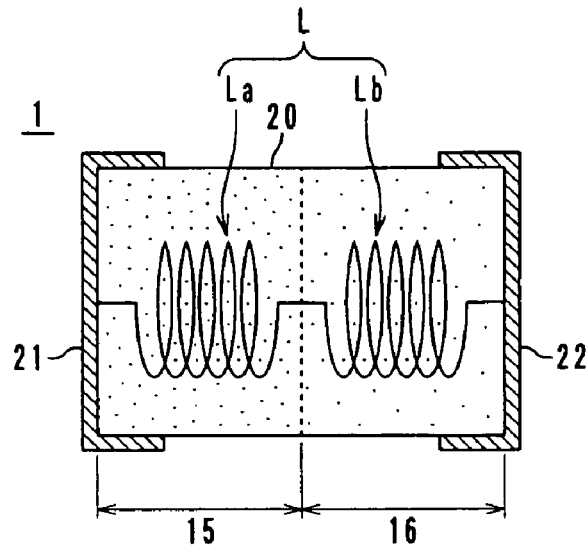
FIG. 4 is a cross-sectional view which schematically shows the monolithic ceramic electronic component shown in FIG. 2.

Next, the sintered ceramic laminate 20 which has been impregnated with the resin is subjected to barrel grinding so that the metal surfaces of the external electrodes 21 and 22 are more securely exposed, and plating layers are formed on the surfaces of the external electrodes 21 and 22 by nickel plating and tin plating. A monolithic inductor 1 shown in FIG. 4 is thus obtained.

In the monolithic inductor 1 having the structure described above, the coil portion 16 composed of the ferrite ceramic having a small number of pores has a high permeability, and the coil portion 15 composed of the ferrite ceramic having a large number of pores has a low permeability. In the first preferred embodiment of the present invention, the high-permeability coil portion 16 has an initial permeability of 430, and the low-permeability coil portion 15 has an initial permeability of 133.

Furthermore, in the coil portion 16 including the ferrite ceramic having a small number of pores, the permeability and the dielectric constant are high, and in the coil portion 15 including the ferrite ceramic having a large number of pores, the permeability and the dielectric constant are low. Consequently, the inductance of the first coil La in the coil portion 15 is lower than the inductance of the second coil Lb in the coil portion 16. The stray capacitance Ca formed in parallel with the first coil La in the coil portion 15 is smaller than the stray capacitance Cb formed in parallel with the second coil Lb in the coil portion 16. Consequently, the resonant frequency, i.e., $Fa=\frac{1}{2}\pi(LaCa)^{1/2}$, of an LC parallel resonant circuit containing the first coil La and the stray capacitance Ca is higher than the resonant frequency, i.e., $Fb=\frac{1}{2}\pi(LbCb)^{1/2}$, of an LC parallel resonant circuit containing the second coil Lb and the stray capacitance Cb. As a result, a monolithic inductor 1 having high impedance in a wide range can be obtained.

Figure 5:
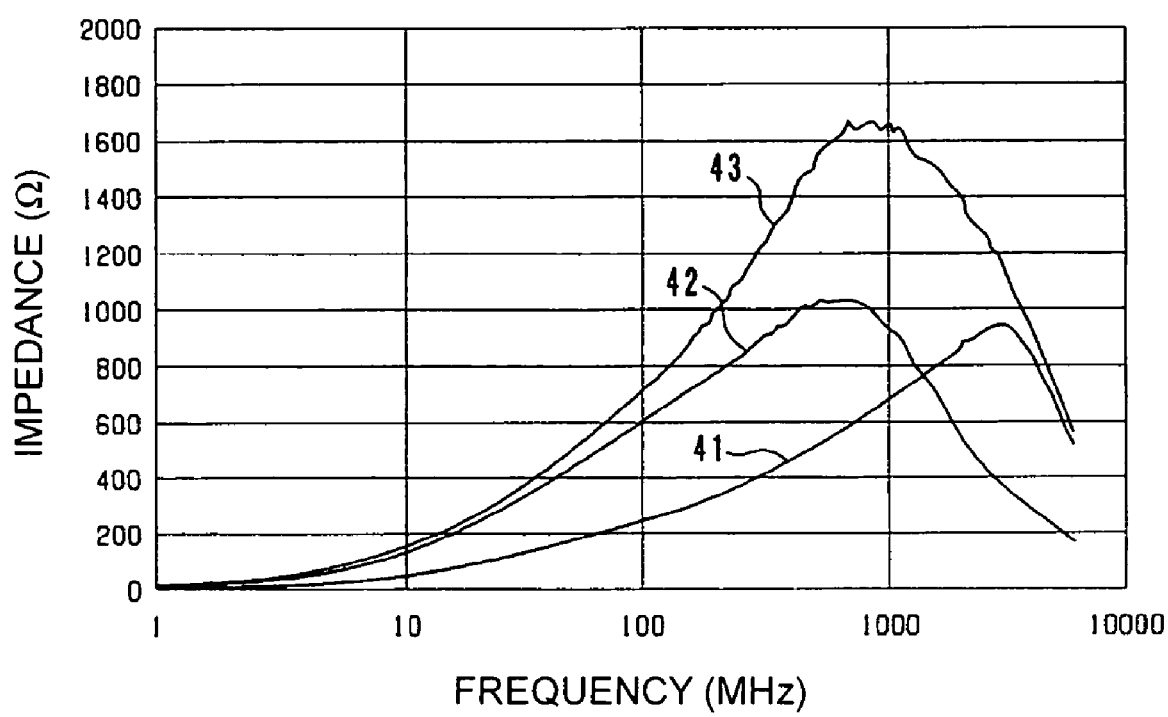
FIG. 5 is a graph which shows the frequency characteristics of the monolithic ceramic electronic component shown in FIG. 4.

FIG. 5 is a graph which shows the impedance characteristics of the monolithic inductor 1. In FIG. 5, the solid line 41 indicates the impedance characteristics of the low-permeability coil portion 15, the solid line 42 indicates the impedance characteristics of the high-permeability coil portion 16, and the solid line 43 indicates the resultant impedance characteristics of both.

As is evident from the graph, it is possible to obtain a monolithic inductor 1 in which a noise reduction effect is achieved over a wide range of high impedances.

Since the same ferrite material is used for the ferrite ceramic materials, bonding strength at the bonding interface between the low-permeability coil portion 15 and the high-permeability coil portion 16 is stronger compared with the conventional monolithic inductor including a nonmagnetic intermediate layer. Furthermore, since the shrinkage rate of the low-permeability coil portion 15 is substantially equal to the shrinkage rate of the high-permeability coil portion 16 during firing, satisfactory bonding is easily obtained. Moreover, there is no risk that the magnetic properties of the coil portions 15 and 16 are degraded due to interdiffusion between the ferrite ceramic materials of the low-permeability coil portion 15 and the high-permeability coil portion 16.

The monolithic inductor 1 is preferably a horizontal winding type inductor in which the stacking direction of the ceramic green sheets 12 and 13 is substantially parallel to the mounting surface of the ceramic laminate 20 and substantially perpendicular to the external electrodes 21 and 22. The coil portions 15 and 16 having different dielectric constants are disposed in series between the external electrodes 21 and 22, and stray capacitances Ca and Cb are mainly generated between the opposing external electrodes 21 and 22. In the first preferred embodiment, the ratio of the dielectric constant of the coil portion 15 including the ferrite ceramic having a large number of pores to the dielectric constant of the coil portion 16 including the ferrite ceramic having a small number of pores is about 1/10. Since the coil portions 15 and 16 are arranged in series, the stray capacitance of the entire monolithic inductor 1 is reduced, and high-frequency characteristics are improved.

Furthermore, if necessary, the winding directions of the first coil La and the second coil Lb which are respectively contained in the coil portions 15 and 16 may be reversed. Thereby, magnetic coupling between the first coil La and the second coil Lb is suppressed, and a high-frequency noise elimination effect by the first coil La of the low-permeability coil portion 15 and a low-frequency noise elimination effect by the second coil Lb of the high-permeability coil portion 16 are independently exhibited, thus enabling production of a monolithic inductor 1 having a further improved noise elimination effect.

Second Preferred Embodiment

A second preferred embodiment is a monolithic inductor preferably having substantially the same structure as that of the first preferred embodiment. The high-permeability ceramic green sheet and the low-permeability ceramic green sheet are formed as in the first preferred embodiment using the same materials and by the same process except that a pore-forming agent is incorporated into the ferrite material when the high-permeability ceramic green sheet is formed, and the high-permeability coil portion has a porosity of about 20%. The low-permeability ceramic green sheet is formed as in the first preferred embodiment, and the low-permeability coil portion has a porosity of about 60%.

According to the second preferred embodiment, the same advantages as that of the first preferred embodiment are obtained, and since the pore-forming agent is incorporated into both the high-permeability coil portion and the low-permeability coil portion, the shrinkage rates during firing of the two coil portions are close to each other, and the bonding strength therebetween is larger than that of the first preferred embodiment. Furthermore, since the high-permeability coil portion is impregnated with the resin, the strength of the laminate is also increased.

Figure 6:
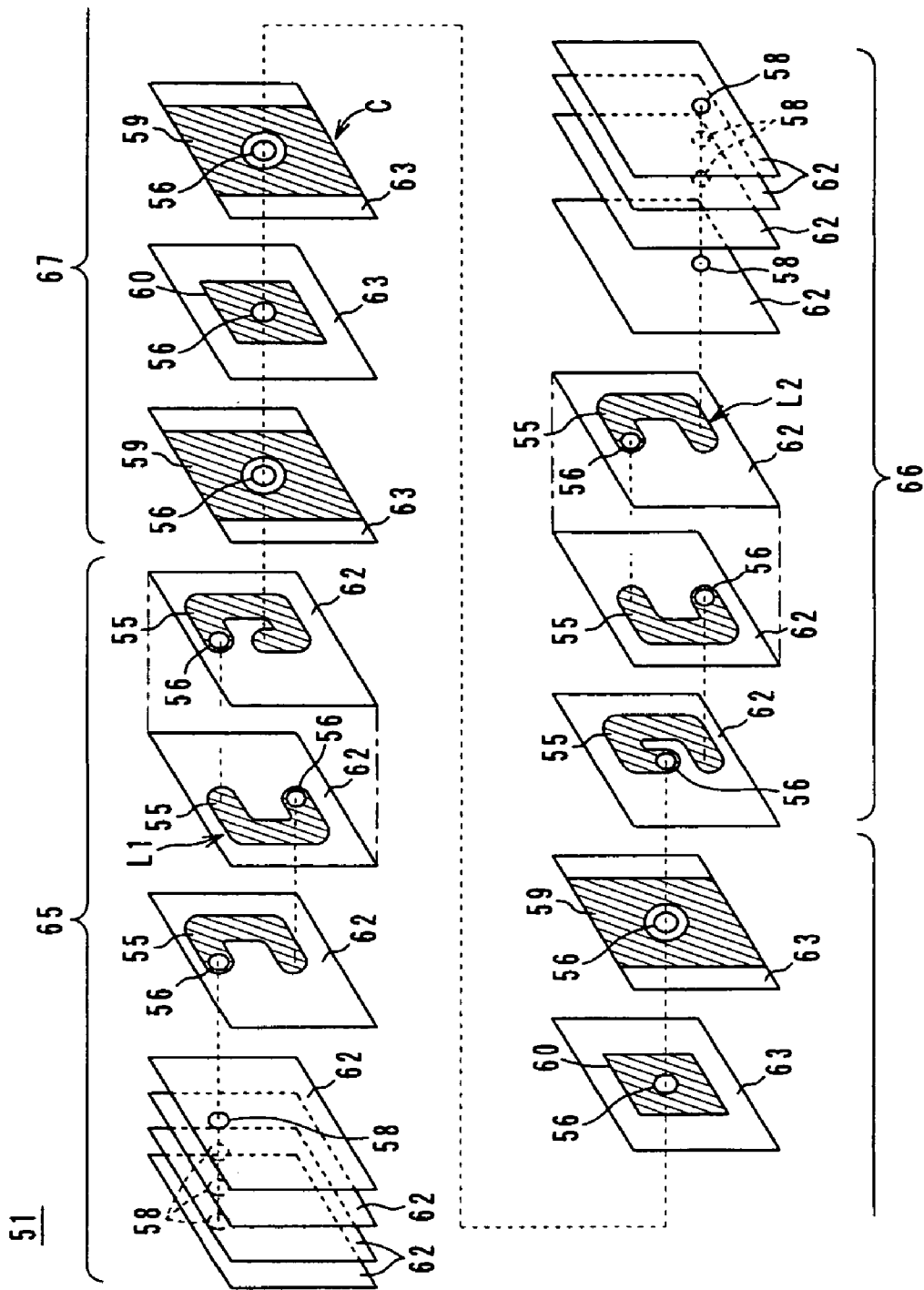
FIG. 6 is an assembly view which shows a monolithic ceramic electronic component according to a third preferred embodiment of the present invention.
Figure 7:
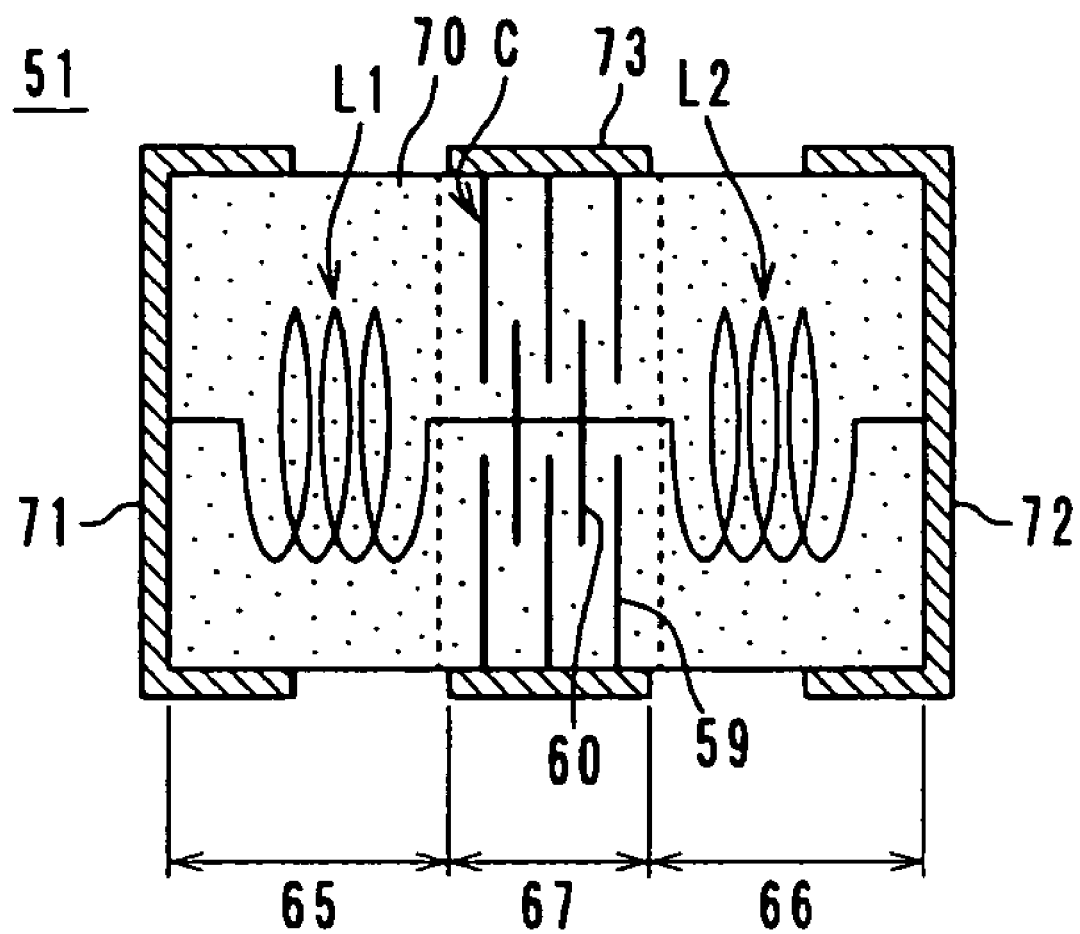
FIG. 7 is a cross-sectional view which schematically shows the monolithic ceramic electronic component shown in FIG. 6.

Third Preferred Embodiment, FIGS. 6 and 7

As shown in FIG. 6, a monolithic LC filter 51 includes coil portions 65 and 66 and a capacitor portion 67 interposed between the coil portions 65 and 66. Each of the coil portions 65 and 66 includes ceramic green sheets 62 provided with coil conductive patterns 55 and via-holes 56 for interlayer connection, and ceramic green sheets 62 provided with via-holes 58 for extraction. The capacitor portion 67 includes ceramic green sheets 63 provided with capacitor conductors 59 and via-holes 56 for interlayer connection and ceramic green sheets 63 provided with capacitor conductors 60 and via-holes 56 for interlayer connection.

The ceramic green sheet 63 is prepared as in the ceramic green sheet 13 in the first preferred embodiment, and a detailed description thereof will be omitted. On the other hand, the ceramic green sheet 62 is prepared as in the ceramic green sheet 12 in the first preferred embodiment except that a pore-forming agent is incorporated into the ferrite starting material so that the porosity is about 80%, and a detailed description thereof will be omitted.

The individual sheets 62 and 63 are stacked and press-bonded, and firing is performed. Thereby, a substantially rectangular parallelepiped sintered ceramic laminate 70 as shown in FIG. 7 is produced. In the coil portions 65 and 66 formed by stacking the ceramic green sheets 62, coils L1 and L2, each including conductive patterns 55 which are electrically connected in series, and many pores are formed.

On the other hand, in the capacitor portion 67 formed by stacking the ceramic green sheets 63, a capacitor C including the opposing capacitor electrodes 59 and 60, and a small number of pores are formed. The capacitor C and the coils L1 and L2 are electrically connected to form a T-type LC filter.

Next, external electrodes 71, 72, and 73 are formed on both end surfaces and a center of the sintered ceramic laminate 70. The external electrodes 71 and 72 are electrically connected to the spiral coils L1 and L2 through the via-holes 58 for extraction, respectively.

Next, the sintered ceramic laminate 70 is immersed in an epoxy resin with a dielectric constant of about 3.4 (alternatively, in a water-soluble glass) so as to be impregnated with the resin. The sintered ceramic laminate 70 which has been impregnated with the resin is subjected to barrel grinding, and then plating layers are formed on the surfaces of the external electrodes 71 to 73. A monolithic LC filter 51 is thereby produced.

In the monolithic LC filter 51 having the structure described above, the capacitor portion 67 including the ferrite ceramic having a small number of pores has a high dielectric constant and a high permeability, and the coil portions 65 and 66 including the ferrite ceramic having a large number of pores have a low dielectric constant and a low permeability. In the third preferred embodiment, the capacitor portion 67 has an initial permeability of 430 and a dielectric constant of 14.5. The coil portions 65 and 66 each have an initial permeability of 65 and a dielectric constant of 4.0.

Consequently, the dielectric constant of the coil portions 65 and 66 can be decreased, and the stray capacitance formed in parallel with each of the coils L1 and L2 can be reduced. As a result, a monolithic LC filter 51 having satisfactory high-frequency characteristics can be obtained. As described above, by forming pores in the coil portions 65 and 66 so that the dielectric constant of the coil portions 65 and 66 is decreased, it is possible to produce, using the same ferrite ceramic material, a monolithic LC filter 51 which is less influenced by stray capacitance.

Although the third preferred embodiment is preferably designed such that the coil portions 65 and 66 have a large number of pores, depending on the specification of the monolithic LC filter 51, the capacitor portion 67 may have a large number of pores.

Other Preferred Embodiments

It is to be understood that the present invention is not limited to the preferred embodiments described above, and within the scope not deviating from the spirit of the present invention, various alterations can be made.

For example, a monolithic ceramic electronic component of the present invention may include three or more element portions having different porosities. Examples of the monolithic ceramic electronic component include monolithic impedance components, monolithic LC filters, monolithic capacitors, and monolithic transformers in addition to monolithic inductors. A monolithic capacitor includes a first element portion and a second element portion, the first element portion being formed by stacking dielectric ceramic layers having a high porosity (i.e., dielectric ceramic layers having a low dielectric constant), the second element portion being formed by stacking dielectric ceramic layers having a low porosity (i.e., dielectric ceramic layers having a high dielectric constant). Furthermore, as the ceramic material, various functional ceramic materials, such as magnetic ceramic materials, dielectric ceramic materials, semiconductor ceramic materials, and piezoelectric ceramic materials, may be used.

In the various preferred embodiments, examples of single products have been described. In the case of mass production, of course, production may be performed using a mother lamination block containing a plurality of monolithic inductors.

Furthermore, when a monolithic ceramic electronic component is fabricated, after the ceramic sheets provided with conductive patterns and via-holes are stacked, the method for integrally firing the stacked ceramic sheets is not particularly limited. The ceramic sheets to be used may be preliminarily fired. Alternatively, a monolithic ceramic electronic component may be produced by the method described below. More specifically, a ceramic layer is formed by coating of a ceramic material in the form of paste by printing or other suitable process, and then a conductive material in the form of paste is applied onto the ceramic layer to form a conductive pattern and a via-hole. Furthermore, the ceramic material in the form of paste is applied thereon to form a ceramic layer. By repeating coating in sequence in such a manner, a ceramic electronic component having a lamination structure can be obtained.

As described above, the present invention is useful in monolithic ceramic electronic components, such as LC composite components, and is excellent in that element portions having different dielectric constants and different permeabilities can be bonded to each other with required strength without providing an intermediate layer.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A monolithic ceramic electronic component comprising:
   a first element portion including a laminate of ceramic layers and internal electrodes; and
   a second element portion including a laminate of ceramic layers and internal electrodes; wherein
   at least the first element portion and the second element portion are stacked to define a ceramic laminate, and a porosity of the ceramic layers of the first element portion is different from a porosity of the ceramic layers of the second element portion; and
   the first element portion includes a first coil defined by the internal electrodes thereof being electrically connected together, the second element portion includes a second coil defined by the internal electrodes thereof being electrically connected together, and the first coil and the second coil are electrically connected to define an inductor.

2. The monolithic ceramic electronic component according to claim 1, wherein the first element portion includes a coil defined by the internal electrodes thereof being electrically connected together, the second element portion includes a capacitor in which any two adjacent electrodes are seperated by a ceramic layer, the porosity of the ceramic layers of the second element portion is lower than the porosity of the ceramic layers of the first element portion, and the coil and the capacitor are electrically connected to define an LC filter.

3. The monolithic ceramic electronic component according to claim 1, wherein the ceramic layers of the first element portion and the ceramic layers of the second element portion are made of the same ceramic material.

4. The monolithic ceramic electronic component according to claim 1, wherein the ceramic layers of the first element portion are made of low-permeability ceramic green sheets and the ceramic layers of the second element portion are made of high-permeability ceramic green sheets.

5. The monolithic ceramic electronic component according to claim 1, wherein the ceramic layers of the first element portion have a relatively small number of pores and the ceramic layers of the second element portion have a relatively large number of pores.

6. The monolithic ceramic electronic component according to claim 1, wherein the first element portion has a high permeability and a high dielectric constant, and the second element portion has a low permeability and a low dielectric constant.

7. The monolithic ceramic electronic component according to claim 1, wherein an inductance of the first coil in the first element portion is lower than an inductance of the second coil in the second element portion.

8. The monolithic ceramic electronic component according to claim 1, wherein a stray capacitance formed in parallel with the first coil of the first element portion is smaller than a stray capacitance formed in parallel with the second coil of the second element portion.

9. The monolithic ceramic electronic component according to claim 1, wherein a resonant frequency of the first element portion is higher than a resonant frequency of the second element portion.

10. The monolithic ceramic electronic component according to claim 1, wherein a winding direction of the first coil is opposite to that of the second coil.

11. The monolithic ceramic electronic component according to claim 1, wherein the porosity of the first element portion is about 30% to about 80% and the porosity of the second element portion is about 10% or less.

12. The monolithic ceramic electronic component according to claim 1, wherein the porosity of the first element portion is about 20% and the porosity of the second element portion is about 60%.

13. The monolithic ceramic electronic component according to claim 1, wherein the monolithic ceramic electronic component is one of a monolithic inductor, a monolithic impedance component, a monolithic LC filter, a monolithic capacitor, and a monolithic transformer.

14. A method for making a monolithic ceramic electronic component comprising:
   stacking ceramic layers and internal electrodes to form a first element portion;
   stacking ceramic layers and internal electrodes to form a second element portion; and
   stacking at least the first element portion and the second element portion to form a ceramic laminate; wherein
   an amount of a granular evaporative pore-forming agent incorporated into a ceramic slurry for forming the ceramic layers of the first element portion is different from an amount of the granular evaporative pore-forming agent incorporated into a ceramic slurry for forming the ceramic layers of the second element portion so that the first element portion and the second element portion have different porosities of ceramic layers.

15. The method according to claim 14, wherein either the ceramic slurry for forming the ceramic layers of the first element portion or the ceramic slurry for forming the ceramic layers of the second element portion is not incorporated with the granular evaporative pore-forming agent.

16. The method according to claim 14, wherein the ceramic slurry for forming the ceramic layers of the first element portion and the ceramic slurry for forming the ceramic layers of the second element portion comprise the same ceramic material.

17. The method according to claim 14, wherein the porosity of the first element portion is about 30% to about 80% and the porosity of the second element portion is about 10% or less.

18. The method according to claim 14, wherein the porosity of the first element portion is about 20% and the porosity of the second element portion is about 60%.

19. The method according to claim 14, wherein the monolithic ceramic electronic component is one of a monolithic inductor, a monolithic impedance component, a monolithic LC filter, a monolithic capacitor, and a monolithic transformer.

* * * * *